United States Patent

[11] 3,588,527

[72] Inventor James Ronald Cricchi
Catonsville, Md.

[21] Appl. No. 813,443
[22] Filed Apr. 4, 1969
[45] Patented June 28, 1971
[73] Assignee Westinghouse Electric Corporation
Pittsburgh, Pa.

[54] SHIFT REGISTER USING COMPLEMENTARY INDUCED CHANNEL FIELD EFFECT SEMICONDUCTOR DEVICES
10 Claims, 8 Drawing Figs.

[52] U.S. Cl. .......... 307/221, 307/251, 307/304, 328/37
[51] Int. Cl. .......... G11c 19/00
[50] Field of Search .......... 307/221, 304, 205, 251, 279, 246; 328/37

[56] References Cited

UNITED STATES PATENTS

| | | | |
|---|---|---|---|
| 3,260,863 | 7/1966 | Burns et al. | 307/205 |
| 3,395,292 | 7/1968 | Bogert | 307/221 |
| 3,406,346 | 10/1968 | Wanlass | 307/221X |
| 3,449,594 | 6/1969 | Gibson et al. | 307/304X |
| 3,483,400 | 12/1969 | Washizuka et al. | 307/221X |
| 3,509,379 | 4/1970 | Rapp | 307/279 |

OTHER REFERENCES

SIDORSKY, MTOS SHIFT REGISTERS, General Instrument Corporation Application Notes, December 1967, pp. 1- — 7. 307/221

*Primary Examiner*—Stanley T. Krawczewicz
*Attorneys*—F. H. Henson and E. P. Klipfel

ABSTRACT: An *n*-bit shift register wherein each bit is comprised of complementary pairs of induced channel field effect transistors fabricated upon a semiconductor substrate and being doped to comprise both enhancement mode P-channel and depletion mode N-channel devices by predetermined doping surface concentration for obtaining faster operation time but effectively operating the depletion mode devices as enhancement mode devices by means of applying a predetermined bias potential to the substrate. By selective grouping of the complementary pairs of field effect transistors the operation may be accomplished by as little as a single-clock signal.

INVENTOR
JAMES RONALD CRICCHI

BY Ernest P. Klipfel
ATTORNEY

INVENTOR
JAMES RONALD CRICCHI

BY Ernest P. Klipfel
ATTORNEY

INVENTOR
JAMES RONALD CRICCHI

BY Ernest P. Klipfel
ATTORNEY

SHIFT REGISTER USING COMPLEMENTARY INDUCED CHANNEL FIELD EFFECT SEMICONDUCTOR DEVICES

BACKGROUND OF THE INVENTION

The present invention relates to shift register circuitry that is characterized by a system which receives a data input signal and transfers it to another system of the same or different character under the control of a shifting or clock signal. More particularly, the present invention is directed to a shift register of the type utilizing complementary pairs of induced channel field effect transistors.

Shift register systems are well-known logic components having many uses among which memory and time delay are examples. Also, such systems are readily adapted to be incorporated into integrated or microminiature circuits which are completely or virtually completely fabricated into a very small element, such as a chip of semiconductor material. This small semiconductor chip will include all of the operative circuit components as well as the necessary connections therebetween. These shift register systems can take many forms such as an array of field effect transistor devices functioning as switches. One such example is the shift register system disclosed in U.S. Pat. No. 3,406,346 granted to F. M. Wanlass. Said patent discloses a shift register system comprised of a pair of transfer stages serially connected between a system input terminal and a system output terminal. The data input signal is transferred from the system input terminal to the system output terminal in two steps, first being transferred from the system input terminal to the first transfer stage and then from the first transfer stage to the second transfer stage with the system output terminal being connected to the second transfer stage. The sequential shifting of the data signal is effected by a two-phase shift control or clock signal, the first phase controlling the first shift to the first transfer stage while the second-phase controls the second shift to the second transfer stage. Once the shift cycle has been completed a feedback or latching means becomes effective to retain the transfer stages in their existing condition until the next shift cycle occurs.

Additionally, the known prior art also discloses the use of complementary pairs of induced channel insulated-gate field effect transistors for a shift register application. Such a teaching occurs for example in the Digest of Technical Papers, 1965 International Solid State Circuits Conference at pages 82–83 in an article entitled "The use of Insulated Gate Field Effect Transistors in Digital Storage Systems" by J. Wood and R.G. Ball. While the shift register circuitry disclosed therein provides the desired results inherent limitations exist as to speed of operation due to the nature of the disclosed devices and the clocking system utilized.

SUMMARY

The present invention is directed to means for enhancing the operation of a shift register utilizing complementary induced channel field effect transistors fabricated in a selected array on a semiconductor substrate so that the doping surface concentration is such that enhancement mode P-channel and depletion mode N-channel devices are provided thereby and wherein a predetermined bias voltage is applied to the substrate for effectively transforming the depletion mode N-channel devices to enhancement mode devices for complementary connection and operation while retaining the faster switch rate capability of a depletion mode device. Additionally, several embodiments of various clocking configurations are included to perform the functions of a shift register.

DESCRIPTION OF THE PREFERRED EMBODIMENTS

Considering the present invention wherein like numerals refer to like parts, the invention is directed to circuits utilizing field effect devices such as metal oxide silicon transistors which may be either P-channel or N-channel devices but more particularly the present invention is directed to the use of complementary field effect devices wherein an N-channel field effect transistor is coupled to and operated in conjunction with a P-channel device with the complementary field effect devices both being part of an integrated circuit built into a small semiconductor chip of semiconductive material such as silicon. A field effect transistor has an input electrode defined as the gate and two output electrodes defined as the source and drain. These electrodes correspond to the base emitter, and collector of a conventional junction-type transistor which is well known to those skilled in the art. Further, a field effect device is adapted to act as a semiconductor switch and has the characteristic that a closed circuit is established between the source and drain electrode when a potential of predetermined polarity has a magnitude exceeding its inherent threshold voltage.

Figure 1:
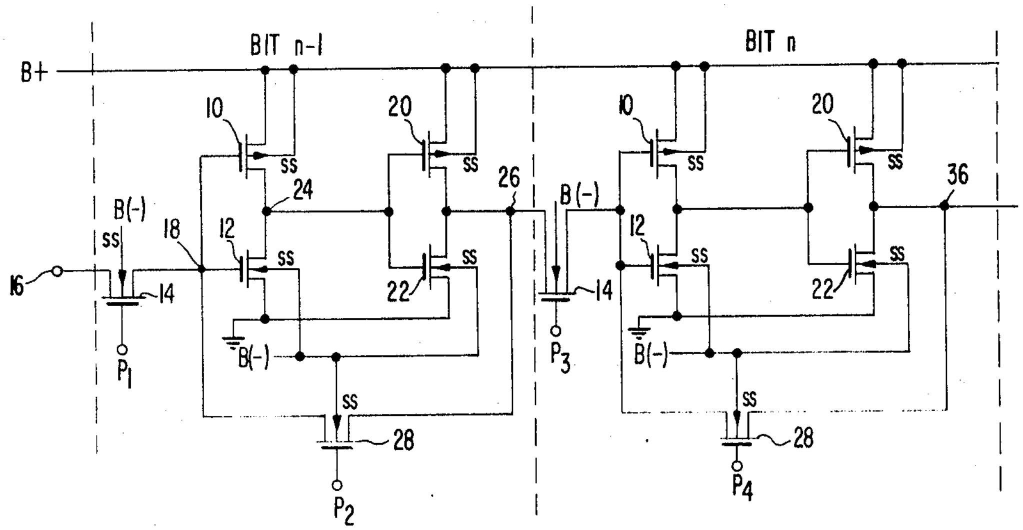
FIG. 1 is an electrical schematic diagram of a shift register in accordance with the teachings of the subject invention under the control of a four-phase clock system.

Directing attention now to FIG. 1, there is disclosed a first embodiment of the subject invention wherein an array of induced channel metal oxide silicon semiconductor field effect transistors or simply MOST are fabricated in a semiconductor substrate identified by the letters *ss* and having a direction arrow being indicative of the semiconductor type of substrate associated with each MOST. For example, an arrow pointing outward from the MOST indicates that the substrate *ss* is of N-type semiconductor material while the arrow pointing inwardly denotes a P-type semiconductor material.

The array of MOST elements in FIG. 1 are coupled together to form an *n* bit shift register wherein each bit is comprised of two pairs of complementary MOST coupled together to form the first and second stage of a two-stage shift register. More particularly and referring to the $n-1$ bit, a first P-channel MOST 10 is connected by means of its source electrode to the drain electrode of a first N-channel MOST 12. The drain electrode of the MOST 10 is connected to a positive power supply potential B+ from a source, not shown, while the source electrode of MOST 12 is connected to a point of reference potential illustrated as ground. This connection is referred to as a complementary pair of MOST devices. An N-channel gating MOST 14 is coupled between the $n-1$ bit input terminal 16 and the common connection between the gate electrodes of MOST 10 and 12 at junction 18 by means of the drain and source electrode of the gating MOST 14. The second pair of complementary MOST comprises the second P-channel MOST 20 and the second N-channel MOST 22 coupled together in the identical fashion as described with respect to MOST 10 and 12. The MOST 20 and 22 comprises the second stage of the shift register bit and is coupled to the first stage by means of the gate electrodes of MOST 20 and 22 commonly connected to the common connection between MOST 10 and 12 at junction 24. The output of the shift register $n-1$ bit is taken from the junction 26 which is the common connection between the source electrode of MOST 20 and the drain electrode of MOST 22. An N-channel feedback MOST 28 is coupled from the output of the second stage at junction 26 back to the input of the first stage at junction 18 by means of its source and drain electrode respectively. The gating MOST 14 and the feedback MOST 28 comprise a third and a fourth N-channel MOST of the bit.

In the embodiment shown in FIG. 1, each MOST of each bit, moreover, is selectively doped so that two P-channel enhancement mode MOST 10 and 20 are fabricated on a N-type substrate while four N-channel depletion mode MOST 12, 14, 22, and 28 are fabricated on the P-type substrate semiconductive material. Both types of substrates are included in a single chip, however. In this regard, it should also be observed that the N-type substrate *ss* of the MOST 10 and 20 are connected to the B+ supply potential while the P-type substrate *ss* of the MOST 12 and 22 is returned to a negative supply potential B−. The purpose of the returning the P-type substrate selectively to the B− potential is to make enhancement mode devices of the depletion mode devices which have comparatively lower junction capacity and therefore faster switch rates since the lower bulk doping level and the reverse bias tend to reduce the junction capacity of the drain junction. This can be explained by considering the charge distribution of an MOST device and noting that the sum of the charge on the gate, the surface state charge, the charge in the inversion layer, and the charge in the depletion layer must be equal to zero. The depletion layer or bulk charge is the charge of the exposed ionized impurity elements that are fixed in the bulk material. If the depletion layer is increased either by increasing the surface potential or by increasing the bias across the depletion layer in the substrate, then the charge in the depletion layer is increased. The effect of a source-to-substrate bias is to increase the threshold voltage. Depletion mode devices then can be made enhancement mode devices in this manner.

Accordingly, the depletion mode MOST elements illustrated in FIG. 1 are transformed into enhancement mode devices which are preferable for the operation of a complementary pair of MOST since enhancement mode field effect devices normally have a threshold potential slightly above or below ground potential depending upon the channel type and operate in response to a gate signal of a single polarity whereas a depletion mode device has a characteristic wherein the drain-to-source current is variable in response to both a positive and a negative potential. In the operation of a complementary pair of enhancement mode MOST, a single input signal will operatively turn one MOST ON while the other MOST is turned OFF so that they are reciprocally and mutually conductive and nonconductive.

A shift register operates to transfer a data input signal through each bit of the shift register, for example from the input terminal 16 to the output terminal provided at junction 26 of the $n-1$ bit of FIG. 1 in accordance with one or more clock signals from a synchronized clock system, not shown. In the embodiment shown in FIG. 1, a four-phase clock system is utilized which comprises four clock signals $P_1$, $P_2$, $P_3$ and $P_4$. The operation of the shift register circuit shown in FIG. 1 can be explained by referring to the waveforms shown in the timing diagram of FIG. 2. Furthermore, the operation of a two stage shift register is generally well known in that the input data is first gated to the first stage and then transferred to the second or output stage in accordance with the clock signal with a latching action taking place at the end of the data transfer to stabilize the operation pursuant to the next period or cycle of operation.

Figure 2:
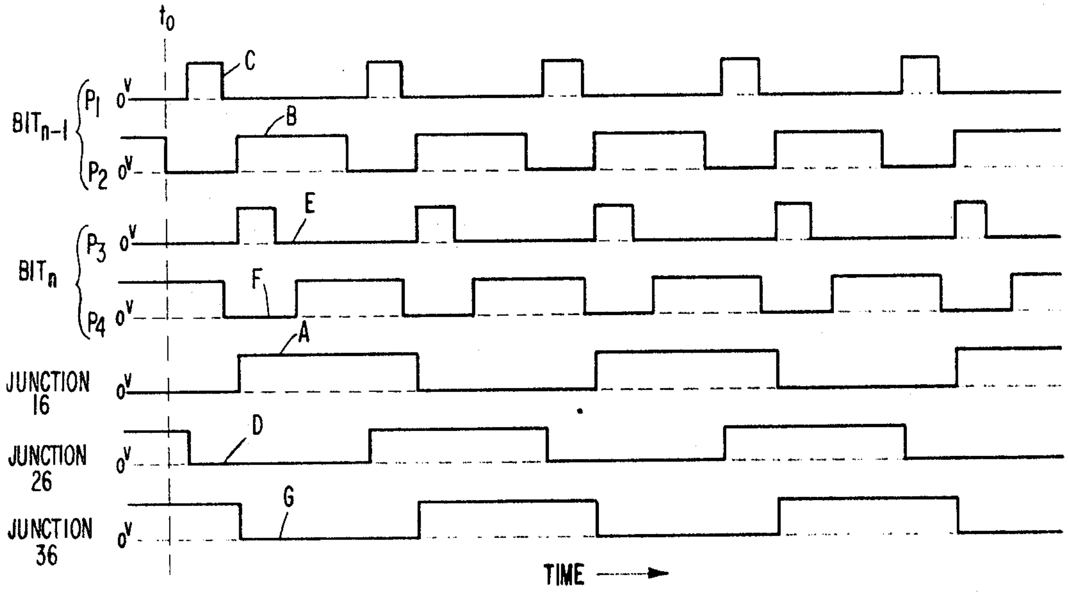
FIG. 2 is a timing diagram of waveforms illustrative of the operation of the embodiment shown in FIG. 1.

In the embodiment shown in FIG. 1 at the beginning of the first period of operation, an input signal shown by waveform A of FIG. 2 is applied to input terminal 16 which is shown being at ground potential. At that instant the clock signal corresponding to $P_2$ and shown by waveform B is applied to the gate of the feedback MOST 28 turning it OFF. Meanwhile, the clock signal corresponding to $P_1$ and shown by waveform C is applied to the gate of the gating MOST 14 and continues to maintain it in an OFF condition. Next the clock signal $P_1$ goes positive turning the switching MOST 14 ON coupling the input signal applied to terminal 16 to the gates of the first stage complementary pair MOST 10 and 12, whereupon they immediately switch states and a signal appearing at junction 24 is coupled to the gates of the second stage complementary pair MOST 20 and 22, which also switch states as shown by the waveform D in FIG. 2, and which is the waveform appearing at junction 26, the output terminal of the $n-1$ bit. Next in time the clock signal $P_1$ applied to the gating MOST 14 returns to ground potential turning the MOST 14 OFF, thereby disconnecting the bit $n-1$ from terminal 16. Following this, the clock signal $P_2$ again goes positive, turning the feedback MOST 28 of the $n-1$ bit ON to latch the condition of the first stage MOST 10 and 12. The signals appearing at the output of the $n-1$ bit (junction 26) is then fed to the $n$th bit under the control of the clock signals $P_3$ and $P_4$ shown by waveforms E and F operating the bit in the same manner as previously described with the output of the $n$th bit being provided at junction 36, which is shown by waveform F. The significant observation to make with respect to the clock signals $P_1$, $P_2$, $P_3$ and $P_4$ is that the phases $P_2$ and $P_4$ are wider than the phases $P_1$ and $P_3$ to insure that a data signal does not bypass any bit along a $n$-bit chain. Also, the time delay between the phases $P_1$ and $P_3$ as shown by waveforms C and E, respectively, is to prevent a race condition from taking place.

Figure 3:
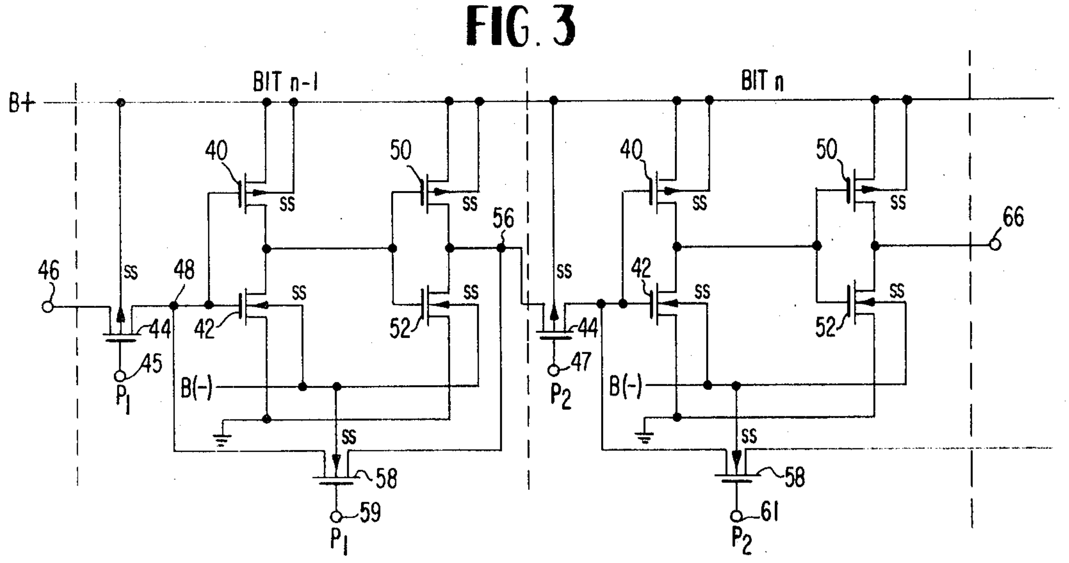
FIG. 3 is an electrical schematic diagram of a second embodiment in accordance with the teachings of the subject invention under the control of a two-phase clock system.

Proceeding now to the second embodiment of the present invention, there is disclosed in FIG. 3 a shift register circuit similar to the embodiment shown in FIG. 1 with the exception that the gating MOST and the feedback MOST are complementary MOST whereas in the embodiment shown in FIG. 1, they are of the same semiconductivity, that is P-channel MOST and only a two-phase clock system is required. Considering the second embodiment in greater detail, a first and a second pair of complementary MOST devices 40 and 42, and 50 and 52, respectively, are coupled together as described with respect to the configuration shown in FIG. 1. Also, MOST 40 and 50 are P-channel MOST, whereas elements 42 and 52 are N-channel MOST devices. The gating MOST 44 of the $n-1$ bit is coupled between the input terminal 46 and the junction 48 comprises a P-channel MOST while the feedback MOST 58 coupled between the output at junction 56 and junction 48 comprises a N-channel MOST. Such a configuration requires only two clock signals $P_1$ and $P_2$ for operating the shift register which are applied respectively to alternate bits $n-1$ and $n$, respectively. For example, the clock signal $P_1$ is applied to the gate electrodes of MOST 44 and 58 of the N−1 bit by means of terminals 45 and 59 while the clock signal $P_2$ is applied to MOST 44 and 58 of the $n$th bit by means of terminals 47 and 61. The waveforms of the clock signals $P_1$ and $P_2$ are shown by waveforms H and J of FIG. 4.

Figure 4:
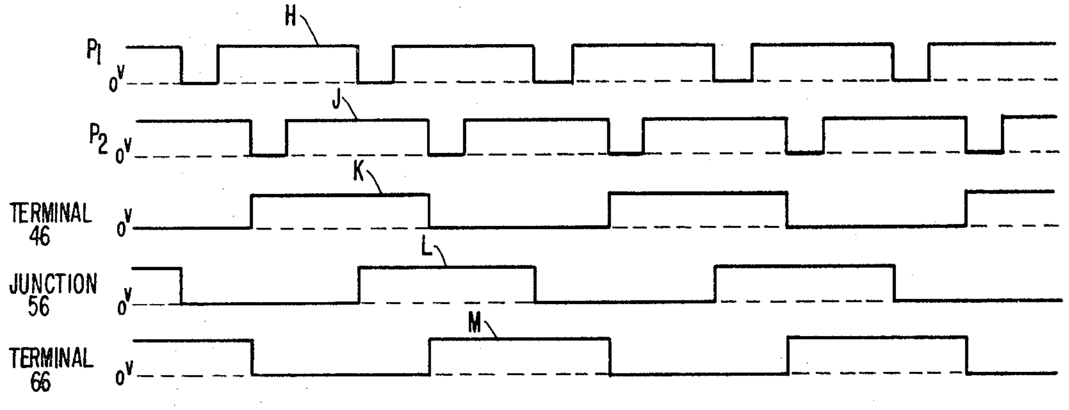
FIG. 4 is a timing diagram of waveforms illustrative of the operation of the embodiment shown in FIG. 3.

Each of the N-channel MOST devices in the embodiment shown in FIG. 3 has a reverse bias applied to the substrate *ss* with respect to the source. For example, the P-type semiconductor substrate *ss* has a negative bias B− applied while the source is at ground. The effect of biasing the substrate not only creates enhancement mode devices of the N-channel MOST utilized, but increases the threshold potential for turning the devices ON and OFF. This is shown by reference to FIG. 5, which illustrates this condition. Accordingly, one clock signal for example, the clock signal $P_1$, controls the N−1 bit due to the fact that MOST 44 and 58 are of opposite type semiconductivity and the one clock signal will turn one MOST on while it turns the other OFF. By means of the substrate biasing and the offset of the threshold voltages effected thereby, the signal $P_1$ will turn OFF the feedback MOST 58 before the gating MOST 44 turns ON and will turn OFF the gating MOST 44 before the feedback MOST turns ON. The clock signal $P_2$ will control $n$th bit in the same manner but delayed in time as shown in FIG. 4. By applying the two-phase clock signals $P_1$ and $P_2$ to alternate bits, for example $n-1$ and $n$, the data is stepped through a shift register of $n$ or more bits in a manner previously described and shown by means of waveforms K, L and M which correspond to the waveforms appearing at junctions 46, 56, and 66, respectively.

Figure 6:
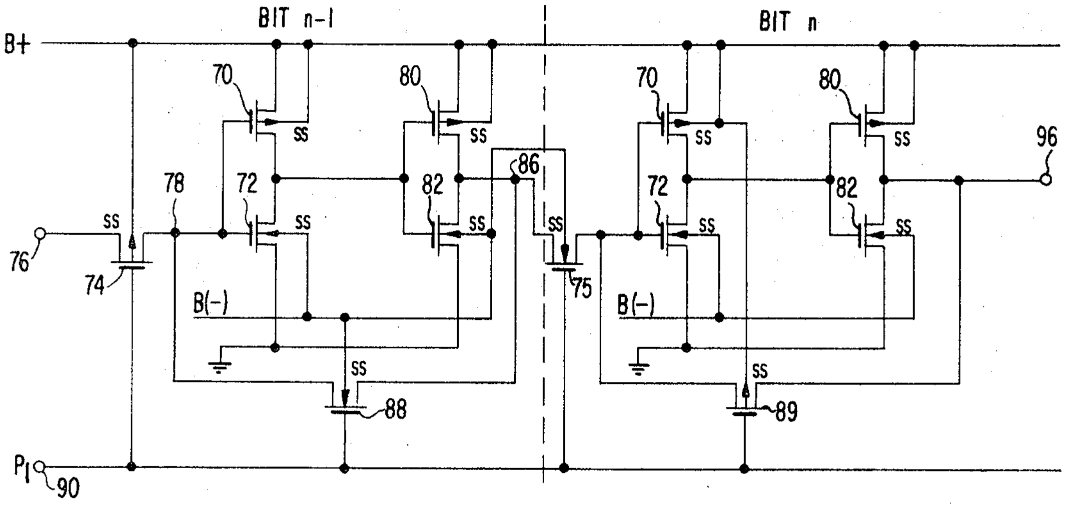
FIG. 6 is an electrical schematic diagram of a third embodiment of a shift register in accordance with the teachings of the present invention under the control of a single-phase clock system.

A third embodiment of the subject invention is also directed to a complementary array of MOST connected as a shift register and more particularly is directed to a shift register wherein a single-clock signal of a single-phase clock system controls the entire operation of the data transfer from the input to the output of the *n*-bit shift register. The embodiment shown in FIG. 6 is similar to the embodiment shown in FIGS. 1 and 3 in that two pairs of complementary MOST comprise the first and second stage of the shift register in addition to a gating MOST and a feedback MOST. Further, the gating and feedback MOST are complementary as is disclosed in the embodiment shown in FIG. 3. What is significantly different, however, is that the complementary relationship of the gating and feedback MOST reverses in the adjacent bit. For example, where the gating MOST of one bit comprises an enhancement mode P-channel MOST, the gating MOST of the bit immediately preceding or following is comprised of a depletion mode N-channel MOST biased to operate as an enhancement mode device. The feedback most of the bits nevertheless still have a mutually opposite semiconductivity so that a P-channel gating MOST is utilized with an N-channel feedback MOST and vice versa.

Figure 5:
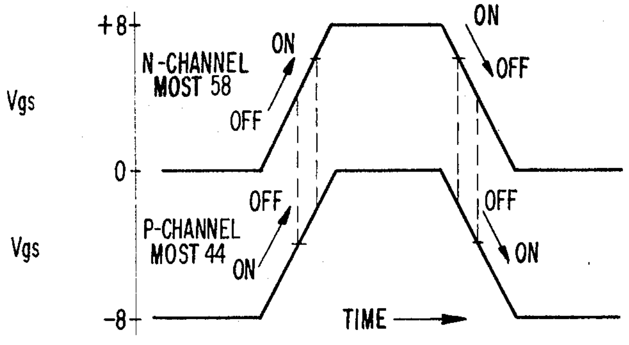
FIG. 5 is a diagram of gate-source voltage waveforms of the field effect transistors utilized in the embodiment shown in FIG. 3.
Figure 8:
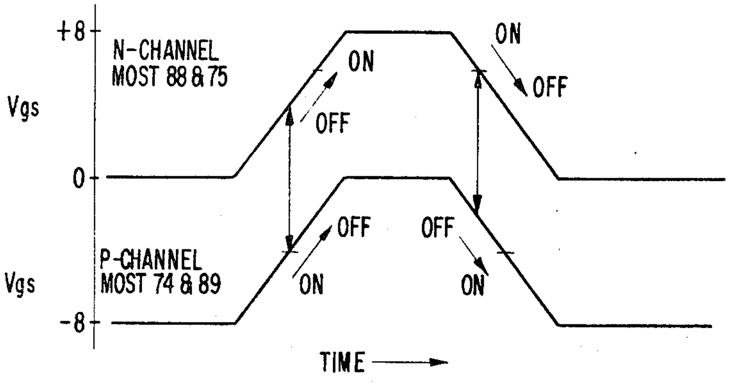
FIG. 8 is a pair of gate-source voltage waveforms of the field effect transistors utilized in the embodiment shown in FIG. 6.

More particularly, the embodiment shown in FIG. 6 schematically illustrates the $n-1$ and $n$-bit of a shift register wherein MOST 70 and 72 are complementary MOST comprising the first stage of a two stage bit while MOST 80 and 82 are coupled together to form a complementary pair of MOST for the second stage. An enhancement mode P-channel MOST 74 serves as the gating MOST between the input terminal 76 and junction 78 of the first stage while a depletion mode N-channel MOST 88 biased to operate as an enhancement mode device serves as the feedback MOST between the second stage and its output at junction 86 back to the junction 78. The adjacent bit or the *n*th bit is comprised of two stages of MOST in the same manner as the N−1 bit and include the MOST 70, 72, 80 and 82. In the *n*th bit, however, the gating MOST 75 is comprised of a N-channel MOST while the feedback or latching MOST 89 comprises a P-channel MOST. Completing the circuit, the substrates *ss* of all of the MOST devices are biased by a potential of predetermined polarity as previously discussed and a single-phase clock signal $P_1$ is applied simultaneously at terminal 90 to the gating MOST 74 and 75 and the feedback MOST 88 and 89 of bits $n-1$ and $n$, respectively. Because of the substrate biasing, the threshold voltages for turning the MOST devices ON and OFF are offset as shown by the diagram of FIG. 8. This corresponds to FIG. 5 shown in the embodiment of FIG. 3.

Figure 7:
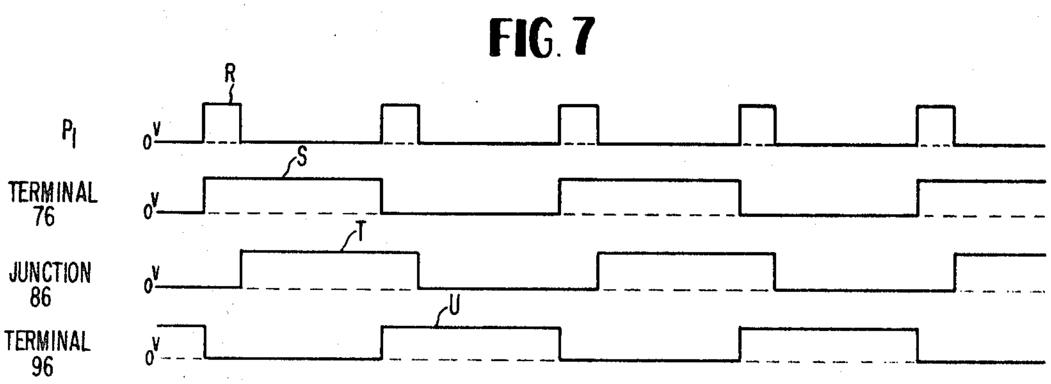
FIG. 7 is a timing diagram of waveforms illustrative of the operation of the embodiment shown in FIG. 6.

The application of the clock signal $P_1$ as shown by waveform R of FIG. 7 operatively turns the latching MOST 88 and 89 OFF before their associated gating MOST 74 and 75 are turned ON and vice versa, as well as turning the gating MOST 74 OFF before turning the following gating MOST 75 ON and vice versa. This is accomplished by the reversal of the channel type of the gating and feedback MOST for adjacent bits. When an input signal such as waveform S in FIG. 7 is applied to input terminal 76, it is translated to the output of the first bit at junction 86 by the application of the first clock pulse as shown by waveform T of FIG. 7, which upon the application of the next clock pulse appears at the output terminal 96 of the *n*th bit as shown by waveform U of FIG. 7. The advantage of an embodiment such as FIG. 6 is immediately evident due to the fact that a complex clock phasing system is not required.

What has been shown and described therefore, is an improvement in field effect transistor circuitry wherein signal translation can be enhanced by greater propagation speed achieved by complementary pairs of field effect transistors and selected biasing of the substrate.

While the subject invention has been described with what is at present considered to be the preferred embodiments of the subject invention, it can readily be seen that modifications will readily be apparent to those skilled in the art. For this reason the present detailed description is not meant to be interpreted in a limiting sense, but is intended to include all modifications, alterations and equivalents which come within the spirit and scope of the present invention.

I claim:

1. An electrical signal translation circuit in the configuration of a shift register utilizing a plurality of semiconductor switches having an input electrode and a first and a second output electrode, and operated by a power supply source and a clock system, comprising in combination:

a semiconductor substrate having both N-and P-type semiconductivity wherein said plurality of said semiconductor switches are fabricated thereon, and including means for applying a positive bias potential to a first portion of said substrate having N-type semiconductivity and means for applying a negative bias potential to a second substrate portion having P-type semiconductivity;

a first and a second pair of complementary semiconductor switches of said plurality of semiconductor switches coupled together as a complementary pair of switches, each of said pair of switches including a common connection between the respective input electrodes and a common connection between the first output electrode of one semiconductor switch and a second output electrode of the other semiconductor switch and including means for coupling the second output electrode of said one semiconductor switch and the first output electrode of said other semiconductor switch between a supply potential of predetermined polarity from said power supply source and a point of reference potential;

circuit means coupling the common connection between the output electrodes of said first pair of semiconductor switches to the common connection between the gate electrodes of said second pair of semiconductor switches;

input and output means;

another semiconductor switch coupled between said input means and the common connection between the input electrodes of said first pair of semiconductor switches by means of the first and second output electrode of said another semiconductor switch;

still another semiconductor switch of said plurality of semiconductor switches coupled between the common connection between output electrodes of said second pair of semiconductive switches and the common connection between the input electrodes of said first pair of semiconductive switches by means of the first and second output electrode thereof;

circuit means coupling the common connection between the output electrodes of said second pair of semiconductor switches to said output means; and means coupled to the input electrodes of said another semiconductor switch and said still another semiconductive switch for applying at least one clock signal thereto from said clock system for translating an input signal from said input means to said output means in accordance with selective operation of said another semiconductor switch and said still another semiconductor switch between conductive and nonconductive states.

2. The invention as defined by claim 1 wherein said combination defines one bit of an *n*-bit shift register and wherein said plurality of semiconductive switches comprise field effect transistors and wherein said input electrode comprises a gate electrode, the first output electrode comprises a source electrode, and the second output electrode comprises the drain electrode and said another semiconductor switch comprises the gate field effect transistor and said still another semiconductor switch comprises the feedback field effect transistor.

3. The invention as defined by claim 2 wherein the gate field effect transistor and said feedback field effect transistor are of the same semiconductivity type and wherein said at least one clock signal is applied to the gate electrode of the gate field transistor and a second clock signal is applied to the gate of the feedback field effect transistor.

4. The invention as defined by claim 3 and including another identical bit adjacently coupled to said one bit by means of said respective input and output means and wherein said adjacent bit includes means for applying a third clock signal to the gate field effect transistor and a fourth clock signal to the gate electrode of the feedback field effect transistor thereof, whereby said one and another bit of the *n*-bit shift register are controlled by four synchronized mutually different clock signals from said clock system.

5. The invention as defined by claim 2 wherein said gate field effect transistor and said feedback field effect transistor are comprised of complementary semiconductor types; and wherein said at least one clock signal is applied commonly to the gate electrodes thereof.

6. The invention as defined by claim 5 and additionally including another identical bit adjacently coupled to said one bit by means of said respective input and output means and means applying a second clock signal from said clock system, synchronized in timed relationship with said at least one clock signal, commonly to the gate electrode of the gate field effect transistor and the feedback field effect transistor of another bit.

7. The invention as defined by claim 6 wherein said gate field effect transistors of said one and another bits are the same semiconductivity type and the feedback field effect transistors of said one and another bits are of the opposite semiconductivity type.

8. The invention as defined by claim 2 wherein the gate field effect transistor and the feedback field effect transistor are of opposite semiconductivity types and including means for applying said at least one clock signal commonly to the gate electrodes of the gate field effect transistor and the feedback field effect transistor.

9. The invention as defined by claim 8 and including another identical bit adjacently coupled to said one bit by means of said respective input and output means and wherein the gate field effect transistor of said one and another bits of said *n*-bit shift register are of mutually opposite semiconductivity type and wherein said feedback field effect transistor of said one and another bits are also of mutually opposite semiconductivity types, the gate field effect transistor and the feedback field effect transistors of the respective bit being of complementary type semiconductivity, however, and means applying said at least one clock signal commonly to the gate electrodes of the gate field effect transistor and the feedback field effect transistor of said another bit.

10. The invention as defined by claim 1 wherein said semiconductor switches fabricated on said substrate having P-type semiconductivity are comprised of depletion mode N-channel metal oxide silicon induced channel field effect transistors biased to have an enhancement mode of operation and wherein said semiconductor switches fabricated on said substrate having N-type semiconductivity and are comprised of enhancement mode P-channel metal oxide silicon induced channel field effect transistors.